(12) United States Patent
Van Buel et al.

(10) Patent No.: US 7,463,337 B2
(45) Date of Patent: Dec. 9, 2008

(54) SUBSTRATE TABLE WITH WINDOWS, METHOD OF MEASURING A POSITION OF A SUBSTRATE AND A LITHOGRAPHIC APPARATUS

(75) Inventors: Henricus Wilhelmus Maria Van Buel, Eindhoven (NL); Franciscus Godefridus Casper Bijnen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 141 days.

(21) Appl. No.: 11/321,467

(22) Filed: Dec. 30, 2005

(65) Prior Publication Data

US 2007/0153253 A1 Jul. 5, 2007

(51) Int. Cl.
*G03B 27/58* (2006.01)
(52) U.S. Cl. .......................... 355/72; 356/401
(58) Field of Classification Search ............... 355/72, 355/62, 53; 430/22; 356/401
See application file for complete search history.

(56) References Cited

U.S. PATENT DOCUMENTS 6,768,539 B2    7/2004 Gui et al.
7,009,708 B1 *  3/2006 Ames .................. 356/484
2003/0224262 A1 * 12/2003 Lof et al. ............. 430/22
2005/0133743 A1  6/2005 Schets et al.

FOREIGN PATENT DOCUMENTS

| EP | 1 420 298 A2 | 5/2004 |
| EP | 1 420 300 A2 | 5/2004 |
| EP | 1 429 188 A2 | 6/2004 |

* cited by examiner

*Primary Examiner*—Hung Henry Nguyen
*Assistant Examiner*—Chia-how Michael Liu
(74) *Attorney, Agent, or Firm*—Pillsbury Winthrop Shaw Pittman LLP

(57) ABSTRACT

A substrate table is provided with an optical system that includes a first window and a second window arranged to allow radiation to pass into an optical arm. At least two mirrors are provided within the optical arm and are arranged to reflect radiation that is passed through the windows. At least two lenses are positioned to receive radiation reflected from the mirrors, wherein the first window is provided with a first alignment mark and the at least two mirrors and at least two lenses are arranged to form an image of the first alignment mark at the second window. A second alignment mark is provided in the second window, or in the substrate table at a location adjacent to the second window.

4 Claims, 7 Drawing Sheets

SUBSTRATE TABLE WITH WINDOWS, METHOD OF MEASURING A POSITION OF A SUBSTRATE AND A LITHOGRAPHIC APPARATUS

1. FIELD OF THE INVENTION

The present invention relates to a substrate table arranged to support a substrate provided with at least one substrate mark, the at least one substrate mark having a position that can be measured using an alignment system. The present invention further relates to a method of measuring a position of a substrate on the substrate table.

2. BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Although specific reference may be made to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 436, 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Alignment is the process of positioning the image of a specific point on the mask to a specific point on the substrate that is to be exposed. Typically one or more alignment marks, such as a small pattern, are provided on each of the substrate and the mask. A device may comprise many layers that are built up by successive exposures with intermediate processing steps. Before each exposure, alignment is performed to minimize any positional error between the new exposure and the previous ones, such error being termed overlay error.

However, some of the intermediate processing steps, such as chemical mechanical polishing (CMP), rapid thermal annealing, thick layer deposition and deep trench etching, can damage or distort the alignment marks on the substrate or bury them under opaque layers. Thus, sometimes the alignment marks are not clearly visible or not visible at all, negatively influencing the accuracy of alignment. This can cause overlay errors.

In some technologies, such as micro systems technology (MST) and micro electromechanical systems (MEMS), devices are fabricated using both sides of a substrate. This technology faces a problem with performing exposures on one side of a substrate such that they are accurately aligned with features previously exposed on the other side of the substrate. An alignment accuracy of the order of 0.5 microns or better is typically required.

New techniques are developed that allow the imaging of patterning features having even smaller patterns by using so-called immersion techniques. This technique is based on the fact that the space between the lens and the substrate is filled with a fluid, such as water. Since the refractive index of water is higher than the refractive index of air or some low pressure gas, the numerical aperture of the system is increased. This allows the system to image even smaller patterns, while using the same radiation system and projection system. More information about immersion techniques may be found in EP 1 420 298 A2, EP 1 429 188 and EP 1 420 300 A2. The presence of water may, however, influence the alignment measurements. As a result of the presence of water in the space between the lens and the substrate, it becomes difficult to perform alignment measurements on marks provided on the substrate. Furthermore, comparing such 'wet' measurements with previously obtained 'dry' alignment measurements is also rather difficult.

The conventional alignment techniques are all performed on the top side of the substrate, i.e. at the side at which the exposure is performed. This side will be referred to as the first side or the front side of the substrate. Such alignment techniques all measure the position of the substrate by measuring the position of alignment marks provided on the top side of the substrate. However, in combination with immersion techniques and with substrates fabricated from both sides, these conventional alignment techniques are difficult to perform and are less accurate.

Conventional alignment techniques typically use optical measurement techniques that measure the position of alignment marks provided on the top side of the substrate, i.e. the side of the substrate that does not face the substrate table on which the substrate is positioned. This makes it difficult to use these alignment techniques in combination with devices fabricated from both sides since, in that case, a substrate needs to be positioned such that the alignment marks face the substrate table.

In the event immersion techniques are used, the optics of the alignment system are usually positioned outside the area filled with liquid, so the optics and/or the optical signals need to be guided into the liquid. This is not an easy task and requires complicated and expensive techniques.

In order to overcome these problems, alignment techniques have been developed, that are arranged to measure the position of an alignment mark provided on the back-side of the substrate, i.e. the side of the substrate facing the substrate table and the side that is not exposed. This side will also be referred to as the second side of the substrate.

During alignment, the second side faces the substrate table that supports the substrate. In order to allow measuring the position of the alignment marks provided on the second side of the substrate, optical devices are provided in the substrate table. This technique is generally referred to as backside alignment and will be discussed in more detail below. A more extensive description can be found in U.S. Pat. No. 6,768,539.

In general, there is a need for improvements to alignment techniques, back side as well as front side, to allow a more accurate measurement of the position of a substrate located on a substrate table and to achieve better alignment results.

Throughout this specification, reference to an alignment mark being located on a particular side of the substrate includes the alignment mark being etched into a respective side of the substrate and includes having subsequent material deposited on top of the alignment mark such that it is embedded and is no longer necessarily exposed at the surface.

Although specific reference may be made to the use of the apparatus in the manufacture of ICs or MEMs, it should explicitly be understood that such an apparatus has many other possible applications. For example, the apparatus may be employed in the manufacture of integrated optical systems, guidance and detection patterns for magnetic domain memories, liquid-crystal display panels, thin-film magnetic heads, etc.

3. SUMMARY

The invention provides a substrate table that allows improved alignment or alignment in an alternative manner.

According to a first aspect of the invention, there is provided a substrate table provided with an optical system comprising a first window and a second window arranged to allow radiation to pass into an optical arm, at least two mirrors within the optical arm, arranged to reflect radiation passed through the windows, at least two lenses positioned to receive radiation reflected from the mirrors, wherein the first window is provided with a first alignment mark and the at least two mirrors and at least two lenses are arranged to form an image of the first alignment mark at the second window, and a second alignment mark is provided in the second window, or in the substrate table at a location adjacent to the second window According to a second aspect of the invention, there is provided a method of monitoring an optical system provided in a substrate table, the method comprising detecting an image of a first alignment mark, the image being at an opposite end of the optical system from the first alignment mark, detecting a second alignment mark provided adjacent to the image of the first alignment mark, determining the separation between the second alignment mark and the image of the first alignment mark, and monitoring the separation over a period of time.

According to a third aspect of the invention, there is provided a substrate table provided with an optical system comprising a first window and a second window having a surface arranged to allow radiation to pass into an optical arm, at least two mirrors within the optical arm, arranged to reflect radiation passed through the windows, and at least two lenses positioned to receive radiation reflected from the mirrors, wherein the surface of the first and/or second window is 1 mm$^2$ or less.

The substrate table according to the third aspect of the invention may be arranged such that the second window has the same dimensions as the first window. The second window may be arranged to be a different size from the first window, the difference in size corresponding to a magnification factor of the two lenses. The optical system may extend in a direction which is at an angle relative to principle axes of operation of the substrate table.

According to a fourth aspect of the invention, there is provided a method of alignment using an optical system provided within a substrate table, the optical system comprising a first window and a second window are arranged to allow radiation to pass into an optical arm, at least two mirrors within the optical arm are arranged to reflect radiation passed through the windows, and at least two lenses are positioned to receive radiation reflected from the mirrors, wherein the method comprises providing a substrate on the substrate table, the substrate having an alignment mark which is sufficiently big to fill the first window, then determining an aligned position of the substrate by measuring the location of a portion of an image of the alignment mark formed at the second window.

According to a fifth aspect of the invention, there is provided a method of alignment using an optical system provided within a substrate table, the optical system comprising a first window and a second window arranged to allow radiation to pass into an optical arm, at least two mirrors within the optical arm arranged to reflect radiation passed through the windows, and at least two lenses positioned to receive radiation reflected from the mirrors, wherein the method comprises providing a substrate with an alignment mark on the substrate table, forming an image of the alignment mark at the second window, the imaged alignment mark being sufficiently big to fill the second window, then determining an aligned position of the substrate by measuring the location of a portion of an image of the alignment mark formed at the second window.

The method according to the fourth or fifth aspects of the invention may further comprise first determining to a lesser accuracy the position of the substrate, such that the position of the alignment mark is already known to that lesser accuracy. The alignment mark may comprise a diffraction grating.

4. BRIEF DESCRIPTION OF THE DRAWINGS

Embodiments of the invention will now be described, by way of example only, with reference to the accompanying schematic drawings in which corresponding reference symbols indicate corresponding parts, and in which.

5. DETAILED DESCRIPTION

Figure 1:
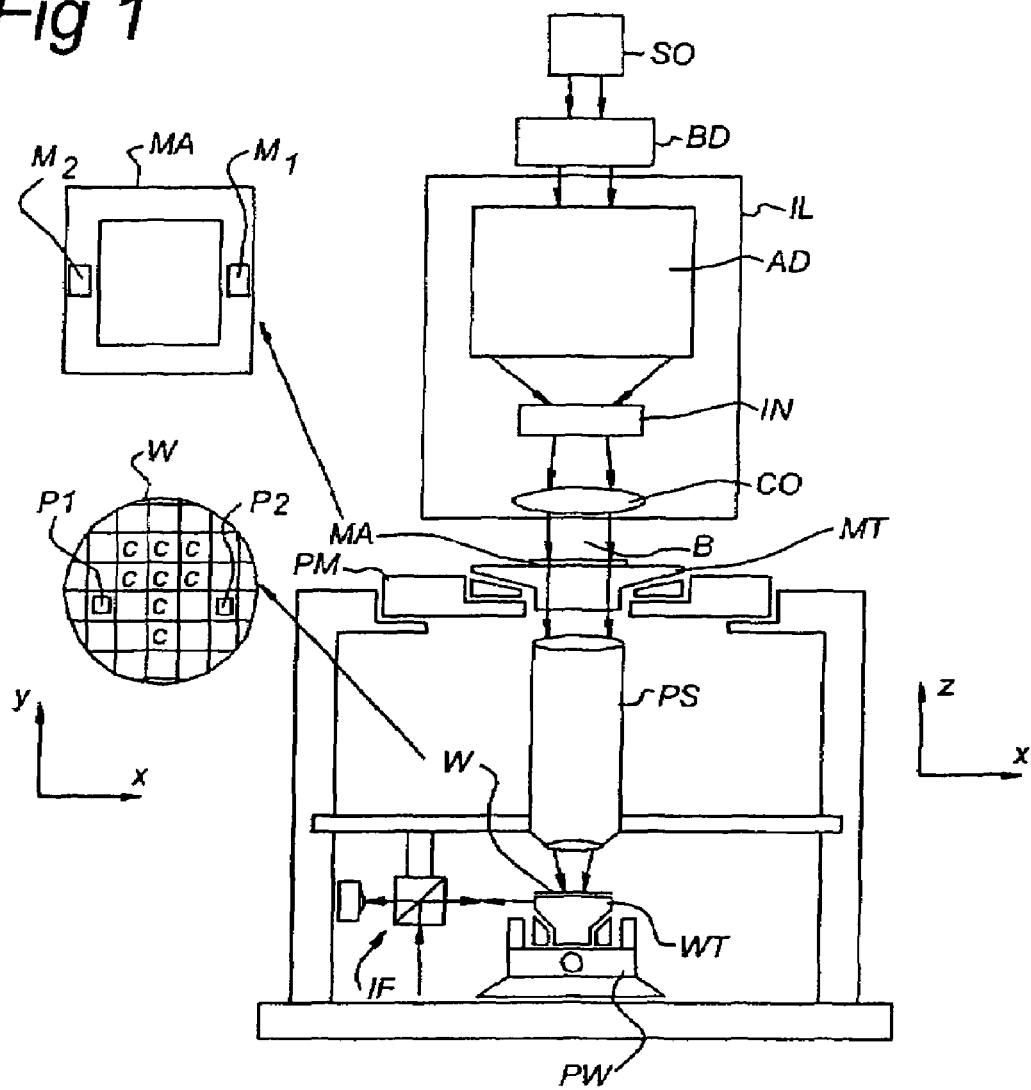
FIG. 1 illustrates a lithographic apparatus according to an embodiment of the invention.

FIG. 1 schematically depicts a lithographic apparatus according to one embodiment of the invention. The apparatus includes:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a substrate table) WT constructed to hold a substrate (e.g. a resist-coated substrate) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

In an exemplary embodiment of the invention, the apparatus is of a transmissive type (e.g. employing a transmissive mask). Alternatively, the apparatus may be of a reflective type (e.g. employing a programmable mirror array or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) may be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks, as illustrated, occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to above.

Combinations and/or variations on the above described modes of use or entirely different modes of use may also be employed.

Figure 2:
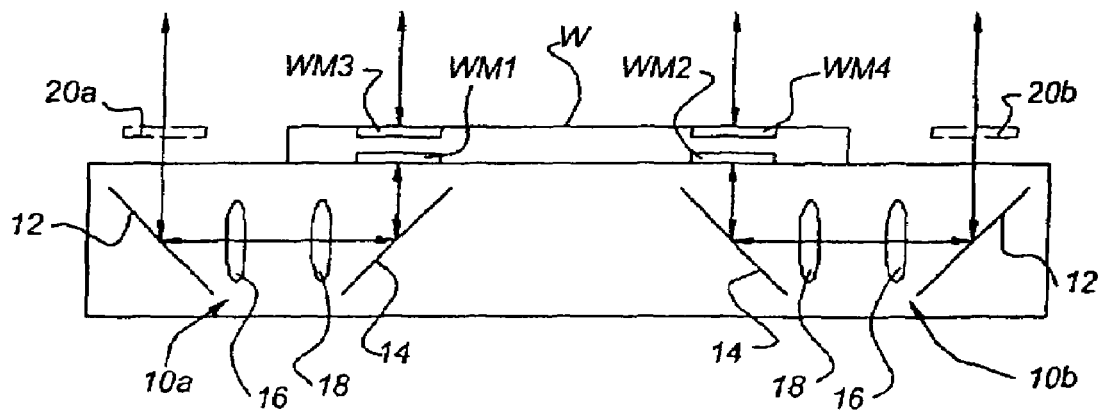
FIGS. 2 to 7 are schematic illustrations of optical systems that may embody the invention.

FIG. 2 shows a substrate W on a substrate table WT. Substrate marks WM3 and WM4 are provided on a first side ("front side") of the substrate W and light may be reflected from these marks, as indicated by the arrows above WM3 and WM4, and used for alignment with marks on a mask in conjunction with an alignment system (not shown). A more detailed description of this is disclosed in US published application no. 2005-0133743, which is hereby incorporated by reference in its entirety.

Further, substrate marks WM1 and WM2 are provided on a second side ("back side") of the substrate W. An optical system is built into the substrate table WT for providing optical access to the substrate marks WM1, WM2 on the back side of the substrate W. The optical system comprises a pair of arms 10a, 10b. Each arm consists of two mirrors, 12, 14 and two lenses 16, 18. The mirrors 12, 14 in each arm are inclined such that the sum of the angles that they make with the horizontal is 90°. In this way, a beam of light impinging vertically on one of the mirrors will remain vertical when reflected off the other mirror. Of course, other ways of obtaining the 180° change in direction can be thought of. For instance, the lenses and the mounting may be designed in such a way that they may take account of a large part of the direction change, as long as the total of the optical system provides a direction change of 180°.

In use, light is directed from above the substrate table WT onto mirror 12, through lenses 16 and 18, onto mirror 14 and then onto the respective substrate mark WM1, WM2. Light is reflected off portions of the substrate mark and returns along the arm of the optical system via mirror 14, lenses 18 and 16 and mirror 12. The mirrors 12, 14 and lenses 16, 18 are arranged such that an image 20a, 20b of the substrate mark WM1, WM2 is formed at the plane of the front (top) surface of the substrate W, corresponding to the vertical position of any substrate marks WM3, WM4 provided on the front side of the substrate W. The order of the lenses 16, 18 and the mirrors 12, 14 may be different, as appropriate to the optical system. For example, lens 18 may be between the mirror 14 and the substrate W (see illustrations of later embodiments).

Image 20a, 20b of substrate mark WM1, WM2 acts as a virtual substrate mark and may be used for alignment by the pre-existing alignment system (not shown) in exactly the same way as a real substrate mark provided on the front (top) side of the substrate W.

Figure 3:
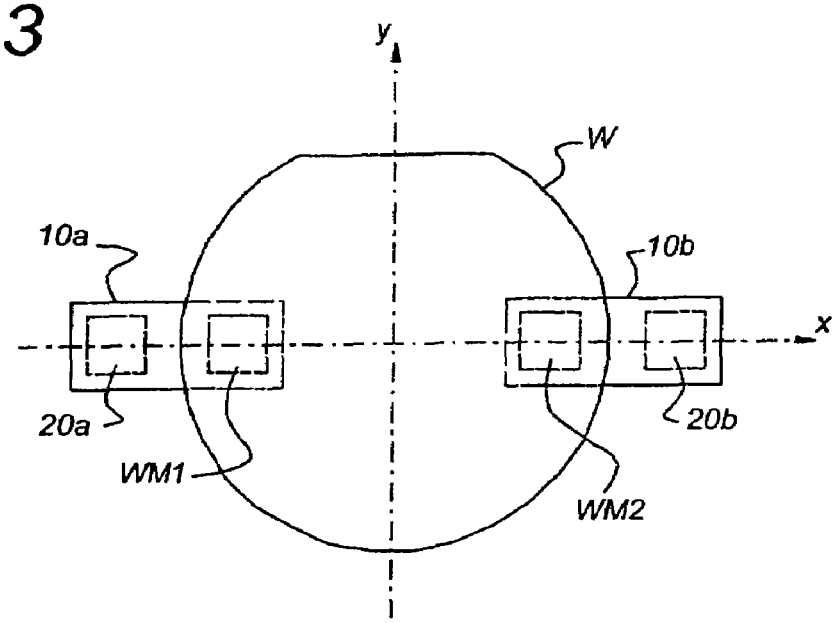
Figure 4:
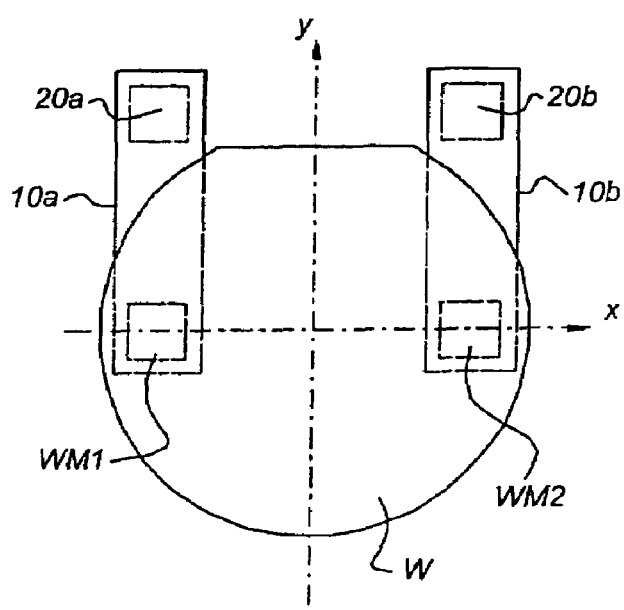

As shown in FIG. 2, the arms of the optical system 10a, 10b produce images 20a, 20b which are displaced to the side of the substrate W so that they may be viewed by an alignment system above the substrate W. Two preferred orientations of the arms of the optical system 10a, 10b are shown in FIGS. 3 and 4, which are plan views of the substrate W, which lies in the XY plane. The substrate table WT is omitted from FIGS. 3 and 4 for clarity. In FIG. 3, the arms of the optical system 10a, 10b are aligned along the X axis. In FIG. 4, the arms of the optical system 10a, 10b are parallel to the Y axis. In both cases, the substrate marks WM1, WM2 lie on the X axis. The substrate marks WM1, WM2 are located on the underside of the substrate W, so they are reversed from the point of view of the top side of the substrate W. However, the arrangement of the mirrors 12, 14 of the arms of the optical system may be configured so that the images 20a, 20b of the substrate marks WM1, WM2 are restored proper orientation. Thus the images appear exactly the same as if they were on the top side of the substrate W. The optical system also may be arranged so that the ratio of the size of a substrate mark WM1, WM2 to its image 20a, 20b is 1:1 i.e. there is no magnification or reduction. Consequently, the images 20a, 20b can be used exactly as if they were real substrate marks on the front side of the substrate W. A common alignment pattern or key provided on a mask may be used to perform alignment with both real and virtual substrate marks.

In the current example, substrate marks are provided on both the front and back sides of the substrate W at corresponding positions, as shown in FIG. 2. In FIGS. 3 and 4, only the substrate marks on the back side of the substrate W are shown, for clarity. According to this arrangement, when the substrate W is flipped over, by rotation about either of the X or Y axes, a substrate mark that was on the top side of the substrate W now may be on the underside of the substrate W, but at a position such that it may be imaged by an arm of the optical system 10a, 10b.

It will be noted that, because of the mirror arrangement, displacement of the substrate W in one direction parallel to an arm 10a, 10b of the optical system will displace the corresponding image 20a, 20b of a substrate mark WM1, WM2 on the under side of the substrate in the opposite direction. For example, in FIG. 3, if the substrate W were displaced to the right, the images 20a, 20b would be displaced to the left. Software controlling the alignment system may take this into account when determining the position of the substrate marks WM1, WM2 and when adjusting the relative positions of the substrate W and a mask when performing alignment. If the two arms of the optical system 10a, 10b are symmetric then the separation between the images 20A and 20B will in fact stay constant when the substrate is displaced.

The substrate table WT may be provided with a mirror arrangement that does not change the direction of movement of the images 20a, 20b with respect to the movement of the substrate marks WM1, WM2.

At least two substrate marks may be provided per side of the substrate W. A single mark may provide information about the relative positioning of an image of a specific point on a mask to a specific point on the substrate. However, to ensure the correct orientational alignment and magnification, at least two marks may be used.

Figure 5:
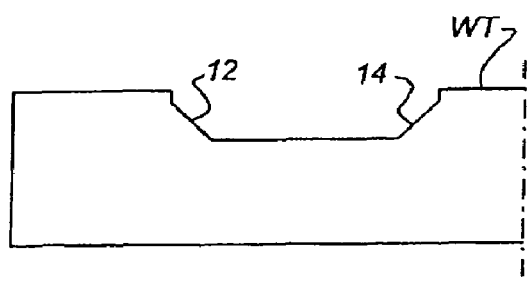

FIG. 5 shows a portion of the substrate table WT in cross section. The optical system 10a, 10b for imaging the substrate marks on the back side of a substrate may be built into the substrate table WT in a particular fashion. As shown in FIG. 5, the mirrors 12, 14 of an arm of the optical system may not be provided as discrete components, but are integral with the substrate table WT. Appropriate faces are machined into the substrate table WT, which may then be provided with a coating to improve reflectivity, thus forming the mirrors 12, 14. The optical system may be made from the same material as the substrate table, such a Zerodur™, which has a very low coefficient of thermal expansion and therefore ensures that high alignment accuracy can be maintained.

The substrate marks WM1, WM2, WM3, WM4 may be provided on the substrate W in order to allow alignment of the substrate W with respect to the projected patterned beam. Alignment is necessary to allow optimal positioning of different layers of the substrate W with respect to each other. A substrate W may be built up from a plurality of layers that are each formed on the substrate W one after the other and are subject to an exposure. Since the different layers are configured to form a working device, the different exposures should be optimally aligned with respect to each other.

As disclosed above, integrated circuits are made in layers. Each layer may start with the exposure of a (different) pattern on the substrate W. This pattern may need to fit optimally on the previous one. A measure for accomplished accuracy in this alignment is overlay O.

A formula may be derived to describe a relationship between the position of the substrate marks WM3, WM4 on the substrate W and the overlay O in case a conventional alignment technique is used, i.e. the substrate marks WM3, WM4 may be positioned on the first side of the substrate W.

Basically, the overlay O depends on how accurate the machine may expose the images and how accurate the substrate position is measured. These are two independent error sources.

The accuracy of the machine in exposing the images is called stage overlay S. The stage overlay S is the overlay difference between a first layer and a second layer when the substrate W stays on the stage in between the two exposures. The stage overlay S is thus a measure for the machine exposure positioning error.

The accuracy that may be obtained when measuring the position of the substrate W depends on the geometrical position of the substrate markers. Substrate alignment parameters include expansion, rotation and translation. The overlay error caused by substrate expansion and rotation are largest at the edge of the substrate.

The following formula may be derived to represent overlay O:

$$O = \sqrt{\left(\left(3\sigma\left(\frac{1}{\sqrt{2}} * \frac{D_W/2}{D_{PM}} + \frac{1}{\sqrt{2}}\right)\right)^2 + S^2\right)} \quad (1)$$

where:
$\sigma$ standard deviation for an alignment position as measured
$D_w$ substrate diameter
$D_{PM}$ distance between two alignment marks
S $3\sigma$ (three times the standard deviation) for the stage overlay, and
O $3\sigma$ (three times the standard deviation) of the overlay.

The value for $\sigma$ is a measure for the error in the distribution of the measurement of a mark position. If the error distribution is considered as a Gaussian distribution, the $3\sigma$ value indicates the error value for which approximately 99.7% of all errors are smaller, as will be understood by the skilled person.

The value of $\sigma_{FS}$ (front side) for measuring a substrate mark positioned on the first side of the substrate differs from the value of $\sigma_{BS}$ (back side) for measuring a substrate mark positioned on the second side of the substrate W. Several reasons may be identified why a different value for $\sigma$ is found for a substrate mark provided on the second side of the substrate W, as for instance:
  more optical elements are used to measure a substrate marker positioned on the second side of the substrate, so the alignment beam passes more optical surfaces;
  the optics used for measuring a substrate marker on the second side of the substrate are more temperature dependent.

Figure 6:
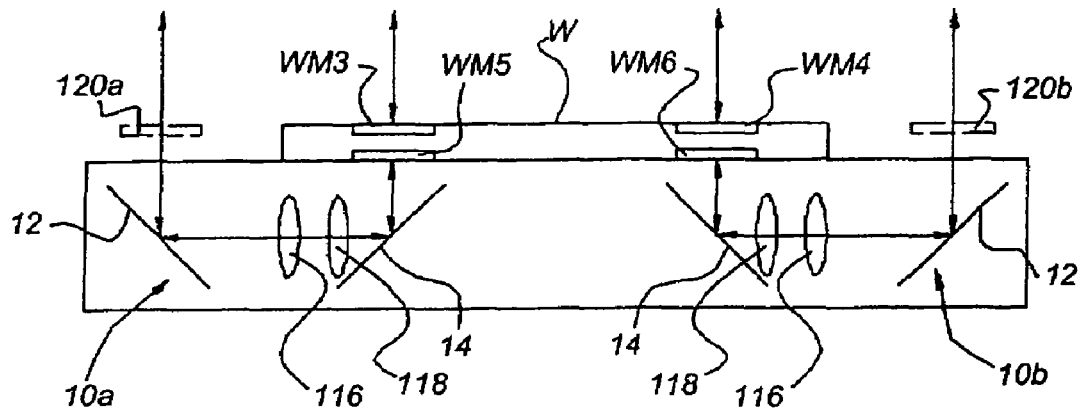

An optical system may be built into the substrate table WT analogous to the optical system shown in FIG. 2 that provides optical access to substrate marks WM5, WM6 on the back side of the substrate W and provides a magnification M. An example of such an optical system is shown in FIG. 6. The same references are used for identical parts seen in previous Figures.

It will be understood that $\sigma$ of formula (1) now becomes $\sigma_{BS}$, that is the sum of $\sigma_{FS}$ plus a term $\sigma_{BF}$ (back to front) taking into account the fact that an image of the substrate marks may be guided to the front side:

$$\sigma_{BS} = \sqrt{\sigma_{FS}^2 + \sigma_{BF}^2} \quad (2)$$

This results in a formula for O:

$$O = \sqrt{\left(\left(3\sqrt{\sigma_{FS}^2 + \sigma_{BF}^2}\left(\frac{1}{\sqrt{2}} * \frac{D_W/2}{D_{PM}} + \frac{1}{\sqrt{2}}\right)\right)^2 + S^2\right)} \quad (3)$$

The optical system comprises a pair of arms 10a, 10b. In one embodiment, each arm may include two mirrors, 12, 14 and two lenses 116, 118. Other configurations may be used.

The mirrors 12, 14 in each arm are inclined such that the sum of the angles that they make with the horizontal is 90°. In this way, a beam of light impinging vertically on one of the mirrors will remain vertical when reflected off the other mirror. It will be understood that this 180° change in direction could also (partially) be obtained by other optical elements provided in the optical system, such as the lenses 116, 118.

The lenses 116, 118 may be designed in such a way that magnified images 120a, 120b of the substrate marks WM5, WM6 may be formed at the plane of the front (top) surface of the substrate W, corresponding to the vertical position of any substrate marks WM3, WM4 provided on the front side of the substrate W. The order of the lenses 116, 118 and the mirrors 12, 14 may be different, as appropriate to the optical system. For example, lens 118 may be between the mirror 14 and the substrate W.

The magnification factor M may be obtained by providing the lenses 116, 118 with different focal distances. The magnification M in this example is M=3, although any other suitable magnification M may be used. It will be understood by a skilled person that the positioning of the mirrors with respect to the substrate marks WM5, WM6 and the magnified images 120a, 120b may be different with respect to the embodiment depicted in FIG. 2, i.e. the distance between the substrate marks WM5, WM6 and the first lenses 116 may equal a third of the distance between the second lenses 118 and the magnified images 120a, 120b. This is schematically shown in FIG. 6. Other configurations may be used.

It will be understood that the distance between the mirrors 12, 14 determine the position in the direction of the optical arms where the magnified images 120a, 120b of the substrate marks WM5, WM6 are found. If the mirrors 12, 14 are positioned further away from each other, the magnified images 120a, 120b may move to the left, and right respectively. The position in the vertical direction, according to the orientation as shown in FIG. 6, where the magnified images 120a, 120b may be found depends on the focal distances of the lenses 116, 118, as will readily be understood by a skilled person. These could for instance be chosen such that the magnified images 120a, 120b are at the same (vertical) level as the substrate marks WM3, WM4 positioned at the front side of the substrate W, as is shown in FIG. 6.

The rest of the alignment hardware may be similar to the hardware used in a system in which no magnification is provided. Therefore, the magnified images 120a, 120b of the substrate marks WM5, WM6 preferably may be of a size that can be detected by the optics present to perform the alignment measurement. To achieve this, the substrate marks WM5, WM6 may be smaller, i.e. a factor M smaller, compared to the substrate markers WM1, WM2 used in the example referring to FIG. 2, in which no magnification was provided.

As a result of the magnification M, the movement of the substrate W may be enlarged with a factor equal to M, thus reducing part of the alignment error. So, $\sigma_{BS}$ as defined in formula (2) is replaced by a new value, referred to as $\sigma_{BS,M}$:

$$\sigma_{BS,M} = \sqrt{\left(\frac{\sigma_{FS}}{M}\right)^2 + \sigma_{BF}^2} \quad (4)$$

In certain cases, the value for $\sigma_{BS,M}$ is even smaller than the value of $\sigma_{FS}$ that may be obtained using direct measurement of wafer marks WM3, WM4 positioned at the front side of the substrate W.

It will be noted that, because of the magnification, displacement of the substrate W in one direction with respect to the optical system may displace the corresponding image 120a, 120b of a substrate mark WM5, WM6 on the under side of the substrate in the opposite direction and with a magnification M. For example, in FIG. 6, if the substrate W is displaced a certain distance to the right, the images 120a, 120b may be displaced M times the certain distance to the left. Software controlling the alignment system may take this into account when determining the position of the substrate marks WM5, WM6 and when adjusting the relative positions of the substrate W and a mask when performing alignment.

The substrate table WT may be provided with a mirror arrangement that does not change the direction of movement of the images 120a, 120b with respect to the movement of the substrate marks WM5, WM6. This can be done in many ways, as will be understood by a person skilled in the art. It may for instance be done using techniques similar to reflex cameras, using a mirror in combination with a prism.

According to formula (2), to obtain $\sigma_{BS}$=7.26 nm, a value of $\sigma_{FS}$=7.1 nm and a value of $\sigma_{BF}$=1.5 nm are needed. When a substrate table WT is, for instance, provided with a magnification factor M=3, the value of $\sigma_{BS,M}$ becomes $\sigma_{BS,M}$=2.80 nm. A new value for the overlay $O_M$ will be obtained from the following formula:

$$O_M = \sqrt{\left(\left(3\sqrt{\left(\frac{\sigma_{FS}}{M}\right)^2 + \sigma_{BF}^2}\left(\frac{1}{\sqrt{2}} * \frac{D_W/2}{D_{PM}} + \frac{1}{\sqrt{2}}\right)\right)^2 + S^2\right)} \quad (5)$$

It may be seen that using back-side alignment with a magnification may provide more accurate results than using conventional back-side alignment or even using front-side alignment.

In principal, the magnification may also be used for substrate marks provided on the front side of the substrate W. Modifications may be implemented to incorporate a design for this at the front side of the substrate table WT. The magnification optics may need to be fixed to the substrate table WT so that the movements of the substrate table WT are not enlarged.

As a result of the fact that the optical system built in the substrate table WT provides an image that has been magnified with a magnification M, the position of the substrate marks WM5, WM6 may be determined in a more accurate way. It will be understood that the capture range of the system may be reduced by a factor equal to the magnification factor M. The capture range is the area in the x and y direction in which the substrate marker may be located in order to detect the right mark position by the measurement system. As a result, in order to find the substrate marks WM5, WM6, the positioning of the substrate W with respect to the optical arms built in the substrate table WT may need to be made more accurate.

Figure 7:
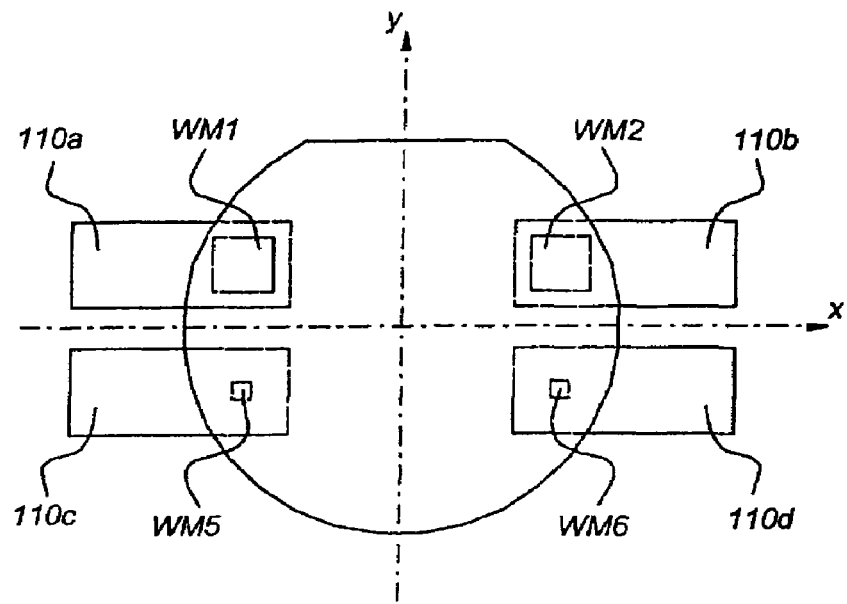

This may be remedied, however, by providing a substrate table WT as depicted in FIG. 7, in which a first pair of optical arms 110a, 110b are used that do not provide magnification, and a second pair of optical arms 110c, 110d are used that provide magnification. The substrate W may be provided with first substrate marks WM1, WM2 that are positioned such that they may be detected via the first pair of optical arms 110a, 1110b. The substrate W may be further provided with second substrate marks WM5, WM 6 that are positioned such that they may be detected via the second pair of optical arms 110c, 110d. The first substrate marks WM1, WM2 have a 'normal' size, which means that they may be detected via the optical arms 110a, 110b according to the state of the art, without providing magnification. The second substrate marks WM5, WM6 have a reduced size, in accordance with the magnification factor M that is built in the optical arms 110c, 110d.

The capture range of the first substrate marks WM1, WM2 is thus larger than the capture range of the second substrate marks WM5, WM6. The alignment may now be performed in two phases. First, an alignment position may be determined using the first substrate marks WM1, WM2 via the first pair of optical arms 110a, 110b. This may result in coarse alignment information. This coarse alignment information is used to find the second substrate marks WM5, WM6 during a second alignment phase, in which a fine alignment position is determined using the second substrate marks WM5, WM6 via the second pair of optical arms 110c, 110c.

A substrate table WT may be designed having a mix of optical arms, having different orientations (e.g. x and y direction) and having different magnifications. In fact, three or more optical branches may be provided having different magnifications M. For instance, three optical branches could be provided in one direction, the first optical branch having a magnification of 1, the second optical branch having a magnification of 3 and the third optical branch having a magnification of 9. The substrate W is in that case provided with three types of substrate marks, each type having dimensions that are adopted to be used in one of the three optical arms. Like this, a cascade of optical branches may be provided.

By using a plurality of optical branches, different alignment strategies may be implemented to improve the overlay accuracy.

The optical arms may also be provided with a structure to vary the magnification M provided by the optics provided in the optical arms. For instance by varying the position of the lenses 116, 118 in the direction of their optical axes the magnification M may be varied. According to a further alternative embodiment, the magnification M may be changed by providing a mechanism to replace a lens with a different lens, having a different focal distance. With the use of such mechanisms the magnification M may be altered based on the situation. It may also be used to overcome the smaller capture range that is associated with magnification of the alignment mark.

Figure 8:
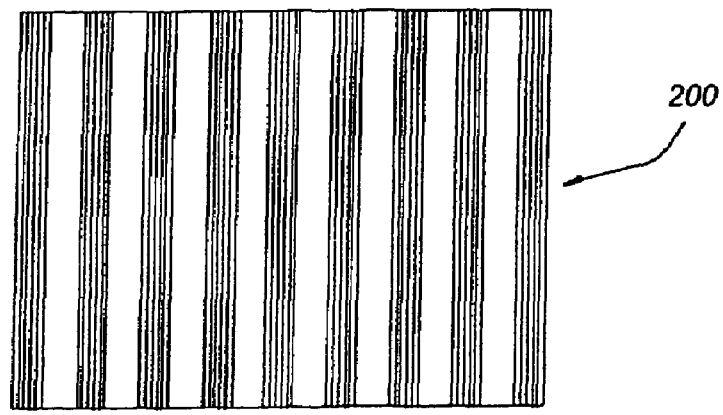
FIG. 8 illustrates an alignment mark that may embody the invention.

The substrate W may also be provided with substrate marks that may be used for different magnifications. FIG. 8 shows an example of such a substrate mark 200, comprising relatively thin lines, that are positioned in groups of, for instance, six (6) thin lines, to form relatively thick lines. The thick lines are used for measurements when using a first magnification factor $M_1$, while the thin lines are used for measurements when using a second magnification factor $M_2$, where $M_1 < M_2$. It will be understood by a skilled person that many other substrate marks are conceivable that may be used in a similar way as substrate mark 200. In fact, all substrate marks having patterns with two or more typical dimensions may be used.

Since the optical arms described above provide the image of the substrate marks WM5, WM6 with a magnification M that enables more accurate measurements, the location of the optical elements, such as the lenses 116, 118 and the mirrors 12, 14 need to be known with a great accuracy. However, these locations do not change with every substrate W and can therefore be corrected for by expressing this error as a systematic error.

It is also possible to use conventional front side substrate marks WM3, WM4 to determine the position of the substrate W in a first instance, for instance to overcome the problem of the small capture range associated with the substrate marks WM5, WM6 that are reduced in size. Based on this first determined position, the position of the substrate W may be determined in a more accurate way by using the substrate marks WM5, WM6 provided on the second side of the substrate W.

This, for instance, may be done in cases where the substrate marks WM3, WM4 provided on the front side of the substrate W may still be used for conventional alignment, but more accurate alignment is required. In that case, a more accurate alignment may be obtained by using the substrate marks WM5, WM6 that are suitable to be used in combination with optical arms provided with a magnification. It will be understood that the apparatus described above may be used to provide a more accurate alignment, front side as well as back side. Providing a magnification M may advantageously be done in an optical arm provided in the substrate table WT.

The substrate table may be provided with a magnification factor M>1, but it may also be provided with a magnification factor M<1, thus in fact being a reduction instead of a magnification. Such a substrate table WT can be used to solve the possible problem that the alignment system used is not able to find the substrate mark WT, when it is outside the capture range of the alignment system. By providing a substrate table WT arranged to provide an image of a substrate mark with a magnification factor being smaller than 1, the capture range is increased. It will be understood that then, instead of reduced substrate marks WM5, WM6, substrate marks should be provided on the substrate W that are increased in size, by a factor 1/M. Thus, in case the magnification factor is chosen M=¼, substrate marks are provided on the substrate W that are increased by a factor 4 (=1¼).

Figure 9:
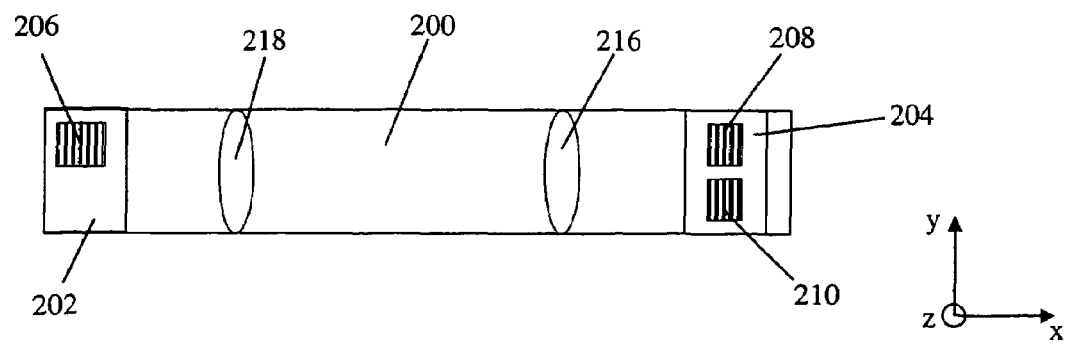
FIGS. 9 to 16 are schematic illustrations of optical systems that embody the invention.

FIG. 9 shows schematically, viewed from above, an optical arm 200 of an alignment apparatus according to an embodiment of the invention. The optical arm 200, which is of the same general form as those described above in relation to FIGS. 2 and 6, includes two lenses 216, 218 and two mirrors (not shown). An object window 202 is provided at one end of the optical arm 200, and an image window 204 is provided at an opposite end. Mirrors (not shown) which correspond to those shown above in FIGS. 2 and 4 are provided beneath the object and image windows 202, 204. An alignment mark 206 is etched or otherwise patterned onto the object window 202. The lenses 216, 218 form an image 208 of the object window alignment mark 206 at the image window 204. A second alignment mark 210 is etched or otherwise patterned onto the image window 204. This image window alignment mark 210 is located adjacent to the image 208 of the object window alignment mark 206.

The embodiment shown in FIG. 9 may be used to monitor expansion, contraction or other variation of the optical arm 200 which may occur for example due to changes in the temperature of the substrate table in which the optical arm is provided. The reason why this is useful may be understood by considering the following examples: a substrate is provided with an alignment mark on its underside, the alignment mark being positioned such that when the substrate is located on a substrate table it lies over the object window 202, with an image of the alignment mark being formed in the image window 204. The optical arm 200 has previously been calibrated, a measurement having been made of the 'image to object vector', which allows a detected location of an alignment mark in the image window to be converted to a location of an alignment mark on the underside of a substrate. However, if some distortion or other change has occurred in the lenses 216, 218 or mirrors (not shown), then this will cause the measured location of the substrate alignment mark to include an error. The embodiment of the invention provides measurement, and correction, of this error. The distortion of other change in the lenses 216, 218 or mirrors may for example be caused by thermal effects.

The image window alignment mark may be replaced by an alignment mark located adjacent to the image window. Where this is done, the embodiment of the invention works in the same way.

During initial calibration, a substrate is provided with alignment marks on its upper surface and underside, which have a known spatial relationship with respect to one another. The position of an underside alignment mark is measured using the optical arm 200, and is compared to the position of an alignment mark on an upper surface of the substrate. This allows the image to object vector to be accurately determined. The separation between the image window alignment mark 210 and the image 208 of the object window alignment mark 206 is then determined. This should be performed sufficiently soon after the measurement of the image to object vector that changes to the dimensions of the optical arm 200, for example due to thermal expansion, have not had time to take place. The separation between the image window alignment mark 210 and the image 208 of the object window alignment mark 206 is recorded and is used as a reference against which subsequent measurements may be compared.

During subsequent lithographic projection of patterns onto substrates, the separation between the image window alignment mark 210 and the image 208 of the object window alignment mark 206 is periodically measured and compared with the reference measurement. Deviations of this separation from the reference separation indicate a change in the dimensions of the optical arm 200, and a corresponding correction of the measured position of a substrate alignment mark is calculated.

The alignment marks 206, 210 may for example comprise diffraction gratings arranged to be detected by a suitable alignment measurement apparatus, examples of which are well known to those skilled in the art. In an embodiment, the alignment marks 206, 210 may be arranged such that one of them has a period which differs slightly, for example by 10%, to that of the other alignment marks. The alignment sensor may be arranged to determine a detected alignment position at which diffraction peaks from both alignment mark coincide. Where this is the case, movement of the image 208 of the object window alignment mark 206 will cause a proportional shift of the detected aligned position.

The positions of the image window alignment mark 210 and the image 208 of the object window alignment mark 206 may be for example detected prior to beginning imaging a pattern onto each substrate. Alternatively, the separation may be measured after a predetermined period of time has elapsed, for example every hour.

The object window 202 and image window 204 are securely fixed into the substrate table. This may be done for example by embedding the windows 202, 204 in the substrate table and securing them using vacuum clamping, which may be assisted by mechanical clamping. The windows may be formed from a material which has a low thermal expansion coefficient, for example Zerodur or diamond.

The optical arm 200 (or indeed the entire substrate table) may be formed from Zerodur, or some material which has a low thermal expansion coefficient, to render it substantially insensitive to changes of temperature. This ensures that the relative locations of the object and image windows 202, 204 do not change, and thereby ensures the accuracy of the embodiment of the invention. Alternatively, or additionally, the location of the object window alignment mark 206 and the image window alignment mark 210 may be periodically measured by the alignment system to determine (and correct for) any movement.

The lenses 216, 218 may be arranged to provide magnification of the object window alignment mark 206, which may be of any suitable value. The effect of any magnification is factored into corrections made to the image of object vector. The lenses 216, 218 may alternatively be arranged to provide no magnification.

Although the optical arm 200 is shown as extending in the y-direction, it will be appreciated that an equivalent optical arm may be provided which extends in the x-direction.

The embodiment of the invention is intended particularly to detect changes of the optical arm 200 which occur due to thermal effects. Since such effects take place over relatively long time scales, it may be possible to integrate several measurements of the separation between the image window alignment mark 210 and the image 208 of the object window alignment mark 206, and thereby obtain a reduction in noise associated with the measurements of their positions.

Although the embodiment of the invention has been described in terms of using an alignment system to monitor the image window, it will be appreciated that an equivalent embodiment may be used in which the alignment system monitors the object window. Since this window will be obscured when a substrate is present on the substrate table, such monitoring would need to occur at times when no substrate is present on the substrate table, for example after imaging onto one substrate has been completed and before imaging onto the next substrate is begun.

Figure 10:
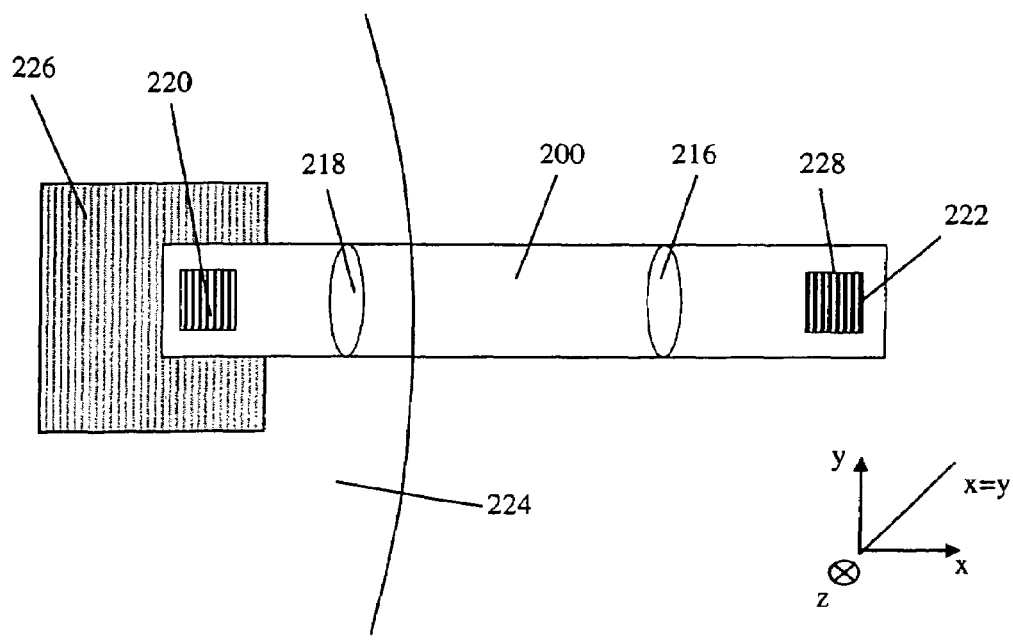

An alternative embodiment of the invention is shown in FIG. 10. FIG. 10 illustrates an embodiment that is schematically viewed from beneath an optical arm 200 that is provided with two lenses 216, 218. The optical arm 200 has the same general configuration as those described above in relation to FIGS. 2 and 6. The optical arm 200 is provided with an object window 220 and an image window 222. Mirrors (not shown) which correspond to those shown above in FIGS. 2 and 4 are provided beneath the object and image windows 220, 222. The object and image windows 220, 222 are smaller than those referred to in relation to previous embodiments of the invention, for example in relation to FIG. 9. A substrate 224 is provided with an alignment mark 226 on its underside. The substrate alignment mark 226 is significantly larger than the object window 220, such that the substrate alignment mark 226 fills the object window 220. To aid understanding and lend clarity to FIG. 10, that portion of the substrate alignment mark 226 which lies over the object window 220 is shown with black shading, and that part of the substrate alignment mark which is not over the object window 220 is shaded with grey shading. The substrate alignment mark 226 may comprise a diffraction grating.

During use of this embodiment of the invention, capture of the substrate 224, i.e. determination of the position of the substrate to within a predefined range of positions is performed using a separate optical arm. The optical arm 200 shown in FIG. 10 is used for fine alignment, i.e. determination of the position of the substrate 224 to a required degree of accuracy.

The substrate alignment mark 226 is sufficiently big that, provided that the substrate 224 has been correctly positioned on the substrate table within which the optical arm 200 is provided, the substrate alignment mark 226 will always fill the object window 220. Because the object window 220 is always filled, light which passes through the lenses 216, 218 to form an alignment mark image 228 at the image window 222 always passes through the same portions of these lenses.

This means that any aberrations or other inaccuracies included in the lenses 216, 218 are applied consistently to the imaged alignment mark 228. These aberrations may be taken into account during initial calibration of the optical arm 200, for example using a substrate which is provided with alignment marks having known related locations on an upper surface and an underside. All future alignment measurements will then automatically take account of such aberrations.

The embodiment of the invention avoids the need to measure and record aberrations or other distortions which are present within the lenses 216, 218. This allows alignment to be performed more simply and efficiently. Instead the aberrations or distortions are automatically taken into account.

An alternative way in which this embodiment of the invention may be understood is that the optical arm 200 is arranged such that the alignment system always sees the same pattern when viewing an alignment mark. It does not see edges of the alignment mark, but instead sees a portion of an alignment mark which from the point of view of the alignment system does not have edges.

In an alternative configuration of this embodiment of the invention, the object window 220 is not filled by the alignment mark, but the image window 222 is filled by the imaged alignment mark 228. This has the same beneficial effect as the configuration described above.

Where the alignment mark 226 is a diffraction grating, for example with an 8 micron period, then capture of the location of the substrate should be determined to an accuracy which is within 8 microns in order to allow correct determination of the alignment position to be made.

Although the optical arm 200 is shown as extending in the x-direction, it will be appreciated that an equivalent optical arm may be provided which extends in the y-direction.

The lenses 216, 218 of the optical arm 200 may be arranged to magnify the substrate alignment mark 226. The lenses may alternatively be arranged to provide no magnification.

The optical arm may be arranged to extend along a line which is parallel to x=y (or which is parallel to x=−y). Where this is the case, alignment in the x and y directions may be performed with a single scan in the x=y (or x=−y) direction. The substrate alignment mark may comprise for example a diffraction grating which extends in the x-direction or in the y-direction.

It will be appreciated that the element comprising object window 220 and image window 228 is substantially larger than the mark 226. For instance, object window 220 and image window 228 may be formed by providing a relatively large element that is transparent to the desired radiation, and then making appropriate sections of the element opaque so that a desired (transparent) surface area remains to form object window 220 (or image window 228).

As noted, in an embodiment object window 220 and/or image window 228 is intended to be smaller than alignment mark 226. Although sizes of alignment marks may vary depending on, e.g., the particular alignment system used, the surface area of the object window 220 and/or image window 228 will generally be less than 1 mm$^2$, e.g. 0.25 mm$^2$ or less, 0.1 mm$^2$ or less, 0.05 mm$^2$ or less, 0.02 mm$^2$ or less, or even 0.01 mm$^2$ or less. In an embodiment, the surface area is at least 0.0005 mm$^2$. With surface area of object window 220 is meant the area of the surface of object window 220 that is arranged to face the alignment mark on a substrate (i.e. the surface facing away from the substrate table). With surface area of image window 228 is meant the area of the surface facing towards the substrate table.

Figure 11:
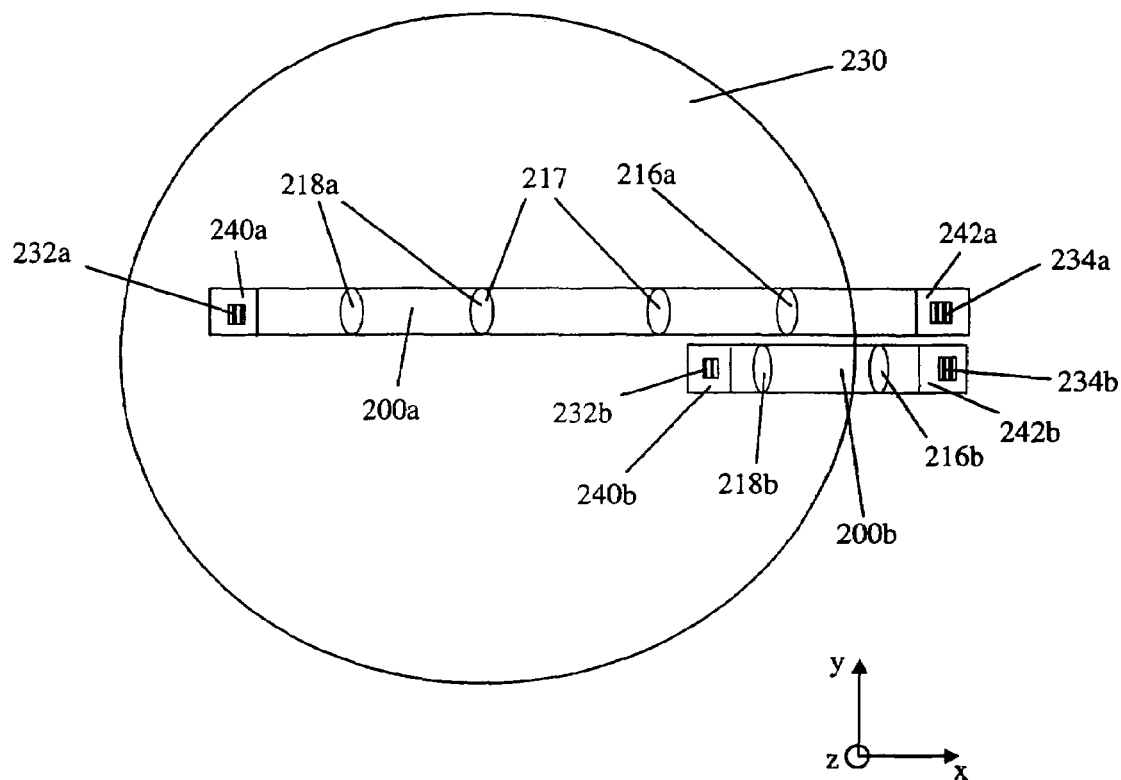

An alternative embodiment of the invention is shown schematically in FIG. 11, which shows from above two optical arms 200a, 200b and a substrate 230. A first of the optical arms extends across the majority of the diameter of the substrate 230. The optical arms 200a, 200b are of a construction which corresponds generally with that shown in FIGS. 2 and 6. Lenses 216a, 218a, 216b, 218b are arranged such that substrate alignment marks 232a,b are formed as alignment mark images 234a,b. An additional pair of lenses 217 is provided in the longer of the optical arms 200a, to allow the alignment mark image 234a to be properly formed without adding to the width and/or depth of the optical arm. Object windows 240a,b and image windows 242a,b are provided in the optical arms 200a,b. Mirrors (not shown) which correspond to those shown above in FIGS. 2 and 4 are provided beneath the object and image windows 240a,b, 242a,b.

In use, a first image alignment mark 234a is scanned or otherwise imaged by an alignment apparatus, and shortly thereafter the second alignment mark image 234b is scanned or otherwise imaged. A time saving is achieved compared to the time that would be required to obtain the two alignment measurements if the first optical arm 200a extended to the left of the substrate 230 instead of extending in the manner shown in FIG. 11. In other words, because the imaged alignment marks 234a,b are close to one another, the total time required in order to pass both of these alignment marks beneath an alignment apparatus is small compared to the time that would have been required if the alignment mark images were on opposite sides of the substrate 230.

The lenses 216a,b and 218a,b of the optical arms 200a,b may be arranged to magnify the substrate alignment mark 232a,b. The lenses may alternatively be arranged to provide no magnification.

It will be appreciated that corresponding optical arms which extend in the y-direction may be provided.

Figure 12:
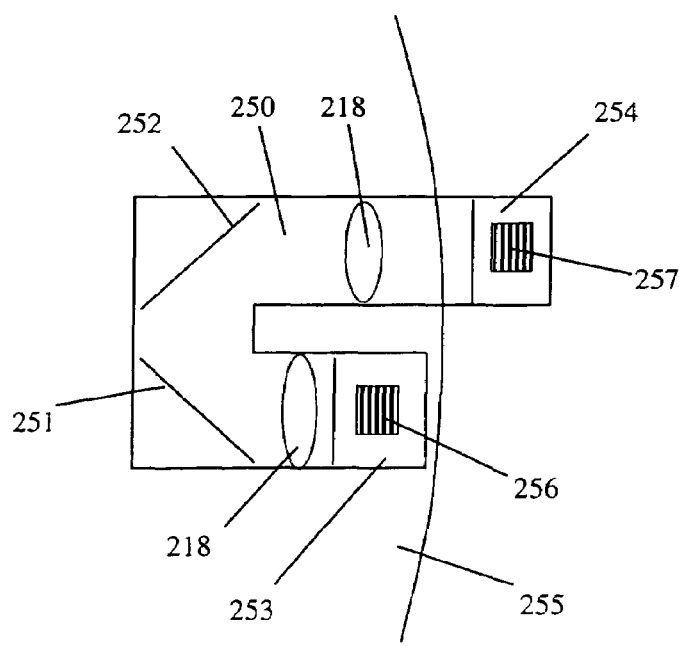

FIG. 12 shows schematically an alternative embodiment of the invention. An optical arm 250 is provided with two 90° bends. The optical arm 250 is provided with mirrors 251, 252 which are arranged to direct light around the 90° bends in the optical arm. With exception of the mirrors 251, 252 the remainder of the optical arm 250 corresponds with optical arms described above in relation to FIGS. 2 and 6. The optical arm 250 includes lenses 216, 218, an object window 253 and an image window 254. Mirrors (not shown) which correspond to those shown above in FIGS. 2 and 4 are provided beneath the object and image windows 253, 254.

In use, a substrate 255 is located on a substrate table in which the optical arm 250 is provided, such that a substrate alignment mark 256 is located over the object window 253. The optical arm 250 forms an image 257 of the alignment mark in the image window 254. The 90° bends provided in the optical arm 250 are such that the alignment mark image 257 is close to the substrate alignment mark 256. This is beneficial because it will reduce the effect of thermal expansion and/or unknown rotation of the substrate table.

Since substrate alignment marks used to obtain alignment of a substrate are provided on an underside of the substrate, in general these are not subject to damage cause by for example chemical mechanical polishing of the substrate. However, in some instances some damage of a substrate alignment mark may take place. For this reason, it may be preferred to provide an optical arm which is capable of allowing higher orders of diffraction from a diffraction grating alignment mark to be detected. In order to do this, lenses in the optical arm may need to resolve the substrate alignment mark with a higher numerical aperture. One way in which this could be achieved is illustrated schematically in FIG. 13.

Figure 13:
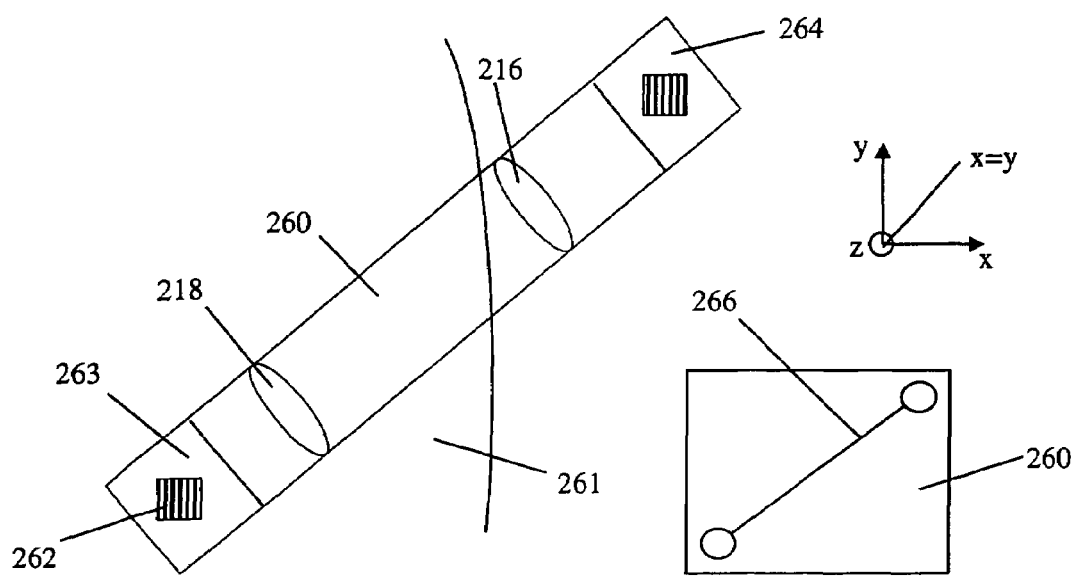

FIG. 13 illustrates an embodiment that is schematically viewed from above an optical arm 260 which extends at 45° to the x and y directions (i.e. along a line parallel to x=y). A substrate 261 is provided with a substrate alignment mark 262 which comprises a diffraction grating 262 that extends in the x-direction. The optical arm 260 corresponds generally to the optical arm described above in relation to FIGS. 2 and 6, and includes lenses 216, 218, an object window 263 and an image window 264. Mirrors (not shown) are provided beneath the object and image windows 262, 264.

FIG. 13 shows schematically a cross section through a central region of the optical arm 260, which shows a diffraction order 266 of the substrate alignment mark 262. Because the optical arm 260 is at 45° relative to the grating of the substrate alignment mark 262, the diffraction order may extend between corners of the optical arm 260 instead of extending either between sides or between the top and bottom of the optical arm. This increase in the distance over which the diffraction order may extend is approximately a factor of 1.42, and may allow for example an additional diffraction order of the substrate alignment mark 262 to be resolved by an alignment apparatus. The use of an additional diffraction order renders the alignment measurement less sensitive to damage of the substrate alignment mark 262.

Figure 14:
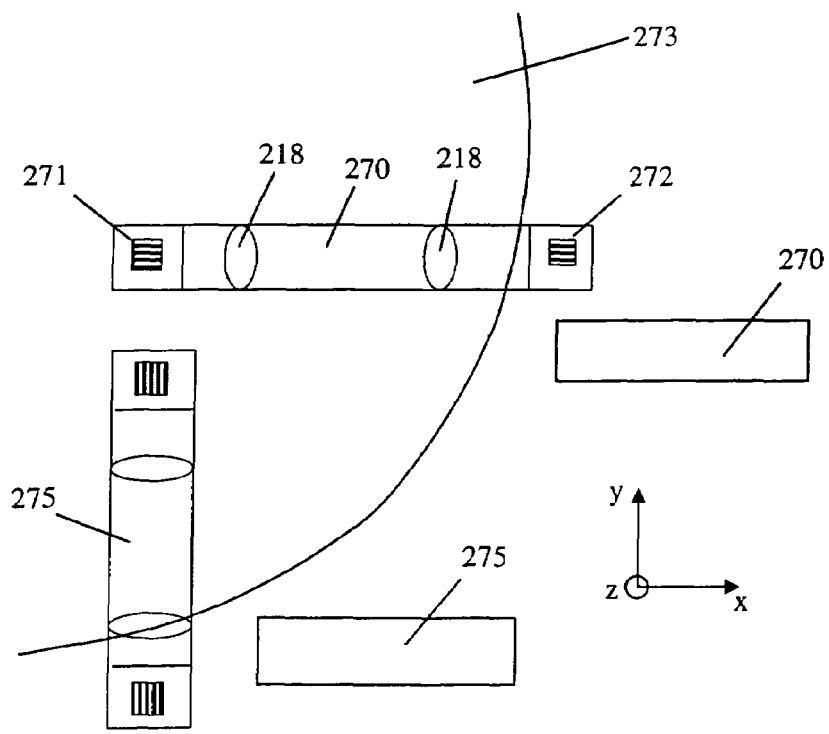

FIG. 14 shows an alternative embodiment of the invention. In common with FIG. 13, optical arms are arranged such that they allow substrate alignment marks to be resolved with a higher numerical aperture, without increasing the depth of the optical arm (the available depth is limited by the depth of the substrate table).

Referring to FIG. 14, a first optical arm 270 extends in the x-direction. A cross section along a central portion of the optical arm 270 is also shown in FIG. 14. The optical arm 270 includes lenses 216, 218, an object window 271 and an image window 272. Mirrors (not shown) are provided beneath the object and image windows 271, 272. The optical arm 270 in cross section is much wider than it is high. The width of the optical arm 270 may be considerable, since it extends along the plane of a substrate table 273 within which it is located. Since the optical arm 270 is wide in the y-direction, it allows an alignment mark which comprises a diffraction grating extending in the y-direction to be resolved with a higher numerical aperture than would otherwise be possible. This allows an alignment system to detect higher diffraction orders, and thereby obtain a more robust alignment of the substrate.

A separate optical arm 275, comprises the same elements as the first optical arm 270 but extends in the y-direction. The second optical arm 275 is also wider than it is high, as shown by the cross section in FIG. 14. This allows a substrate alignment mark which comprises a diffraction grating extending in the x-direction to be resolved with a higher numerical aperture than would otherwise be the case.

Figure 15:
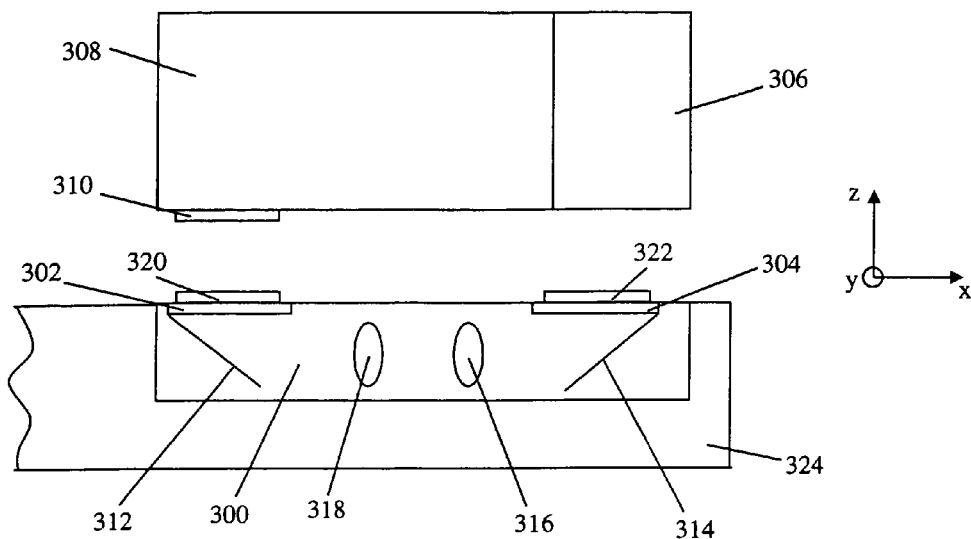

An alternative embodiment of the invention is shown schematically in cross section in FIG. 15. An optical arm 300 is provided with lenses 316, 318 and mirrors 312, 314. The optical arm 300 is further provided with an object window 302 and an image window 304. An alignment system 306 is provided with a support 308 upon which an alignment mark 310 is provided.

The lenses 316, 318 are arranged such that an alignment mark located at the object window 302 is magnified, for example by a factor of 4, at the image window 304.

The alignment mark 310 provided on the alignment system 306 comprises a diffraction grating. Due to an effect known as the Talbot effect, the diffraction grating spontaneously forms an image of itself 320, which will hereafter be referred to as the Talbot image. The Talbot image is magnified by the lenses 316, 318 and forms a magnified alignment mark image 322 at the image window 304. The magnified alignment mark image 322 is viewed by the alignment system 306.

In use, when a substrate table 324 containing the optical arm 300 is moved in the x-direction, the alignment mark image 322 also moves. This movement is in the opposite direction, and is magnified by a factor of 4. The alignment system 306 may monitor the position of the substrate table 324 by monitoring the location of the alignment mark image 322. Because the alignment mark image 322 includes a magnification factor of 4, the accuracy with which the alignment system 306 can determine the location of the substrate table 304 is correspondingly increased.

Figure 16A:
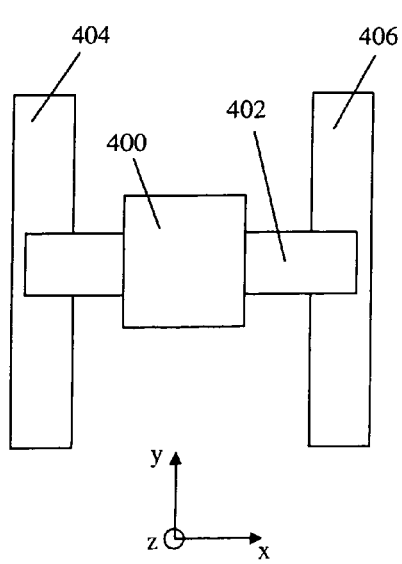

FIG. 16a shows schematically a substrate table 400 mounted on a linear x-direction motor 402, which in turn is mounted on two linear y-direction motors 404, 406. The configuration of linear motors shown in FIG. 16 is used in many lithographic apparatus. During lithography, the substrate table 400 is moved in the x-direction and y-direction to allow different target regions of a substrate held on the substrate table to be located beneath a projection system for lithographic projection. The linear motors are arranged to operate with a high degree of accuracy. For movement in the x-direction, the x-direction linear motor 402 causes the substrate table 400 to translate. For movement in the y-direction, both of the y-direction linear motors 404, 406 are operated simultaneously, such that they cause the x-direction linear motor to be moved in the y-direction. Since movement in the y-direction requires the simultaneous operation of two linear motors 404, 406, a small amount of error may be introduced into the movement. This may be for example due to hysteresis at the linear motors 404, 406. This may cause errors to be introduced during alignment of the substrate with respect to projection optics.

Figure 16B:
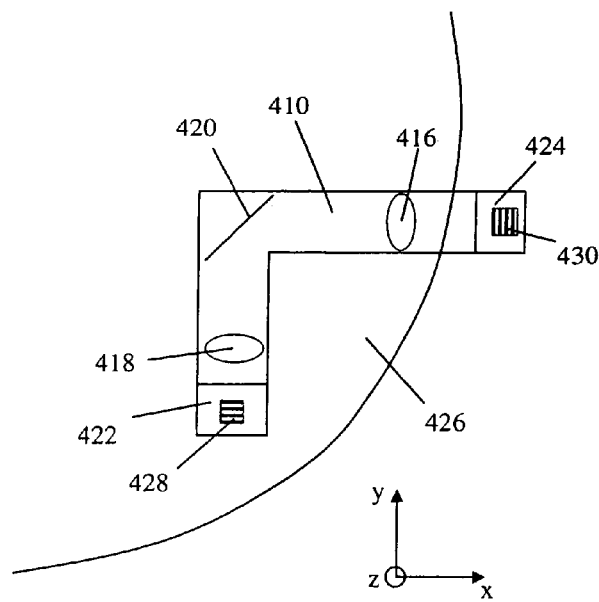

FIG. 16b shows an optical arm 410 which solves this problem by allowing alignment in the y-direction to be achieved whilst scanning the substrate in the x-direction. The optical arm comprises two lenses 416, 418 and a mirror 420. The optical arm 410 further comprises an object window 422 and an image window 424. Mirrors (not shown) are provided beneath the object and image windows 422, 424. The optical arm 410 includes a 90° corner, and this has the effect of allowing alignment in the y-direction to be achieved when scanning in the x-direction. The mirror 420 directs light through the 90° bend.

In use, a substrate 426 is located on a substrate table within which the optical arm 410 is located. The substrate is positioned such that a y-direction alignment mark 428 is located over the object window 422. The optical arm 410 forms an image of the y-direction alignment mark 430 at the image window 424. The alignment mark image 430 may be used for alignment when scanning the substrate 426 and substrate table in the x-direction. The substrate alignment mark 428 comprises a diffraction grating which extends in the y-direction. The effect of the 90° bend in the optical arm 410, and the mirror 420, is to apply a rotation to the alignment mark such that the alignment mark image 430 comprises a diffraction grating which extends in the x-direction. This is what allows the alignment to be performed when scanning in the x-direction.

Since alignment in the y-direction is achieved whilst moving the substrate table 400 in the x-direction, referring to FIG. 16a it can be seen that only one linear motor is used during this alignment (the x-direction linear motor 402), and errors associated with the simultaneous use of two linear motors are thus avoided.

In the above described embodiments of the invention, the lenses 216, 316, 416, 218, 318, 418 may be used to provide magnification of a substrate alignment mark. For example a magnification factor of 4 may be used, such that the image of the substrate alignment mark is 4 times larger than the substrate alignment mark itself. This allows alignment of the substrate to be achieved with increased accuracy. Other magnification factors may be used, for example a magnification factor of 3 or 5, or other values. The magnification factor may be less than 1 (e.g. ¼).

As discussed above, a substrate table WT may be designed having a mix of optical arms, having different orientations (e.g. x and y direction) and having different magnifications. In fact, three or more optical branches may be provided having different magnifications M. For instance, three optical branches may be provided in one direction, the first optical branch having a magnification of ¼, the second optical branch having a magnification of 1 and the third optical branch having a magnification of 4. The substrate W may be provided with three types of substrate marks, each type having dimensions that are adopted to be used in one of the three optical arms. Like this, a cascade of optical branches may be provided.

It will be understood that the embodiments discussed above are exemplary to practice the invention. Other configurations may be used to provide a magnification M.

A magnified image of substrate marks may also be obtained by using fibers, convex and/or concave mirrors instead of lenses. Furthermore, prisms may be used, analogous to a prism used in a reflex camera, to reverse the orientation of the image created of substrate alignment marks. In fact, all kinds of optical elements may be used, as long as a correct redirection, focal plane and magnification are obtained.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

What is claimed is:

1. A substrate table provided with an optical system having an optical arm comprising:
    a first window and a second window arranged to allow radiation to pass into the optical arm;
    at least two mirrors within the optical arm, arranged to reflect radiation passed through the first window and the second window; and
    at least two lenses positioned to receive radiation reflected from the mirrors;
    wherein the first window is provided with a first alignment mark etched or patterned onto the first window and the at least two mirrors and at least two lenses are arranged to form an image of the first alignment mark at the second window; and
    a second alignment mark provided in the second window or in the substrate table at a location that is adjacent to the second window.

2. A substrate table provided with an optical system having an optical arm comprising:
    a first window and a second window arranged to allow radiation to pass into the optical arm;
    at least two mirrors within the optical arm, arranged to reflect radiation passed through the first window and the second window; and
    at least two lenses positioned to receive radiation reflected from the mirrors;
    wherein the first window is provided with a first alignment mark and the at least two mirrors and at least two lenses are arranged to form an image of the first alignment mark at the second window; and
    a second alignment mark etched or patterned onto the second window at a location that is adjacent to the second window.

3. A substrate table provided with an optical system having an optical arm comprising:
    a first window and a second window arranged to allow radiation to pass into the optical arm;
    at least two mirrors within the optical arm, arranged to reflect radiation passed though the first window and the second window; and
    at least two lenses positioned to receive radiation reflected from the mirrors;
    wherein the first window is provided with a first alignment mark and the at least two mirrors and at least two lenses are arranged to form an image of the first alignment mark at the second window; and
    a second alignment mark etched into the substrate table at a location that is adjacent to the second window.

4. A substrate table provided with an optical system having an optical arm comprising:
    a first window and a second window arranged to allow radiation to pass into the optical arm, the first window comprising an image window of the optical system and the second window comprising an object window of the optical system;
    at least two mirrors within the optical arm, arranged to reflect radiation passed through the first window and the second window; and
    at least two lenses positioned to receive radiation reflected from the mirrors;
    wherein the first window is provided with a first alignment mark and the at least two mirrors and at least two lenses are arranged to form an image of the first alignment mark at the second window; and
    a second alignment mark provided in the second window or in the substrate table at a location that is adjacent to the second window.

* * * * *